(12) United States Patent
Kim et al.

(10) Patent No.: US 11,537,254 B2
(45) Date of Patent: Dec. 27, 2022

(54) DISPLAY DEVICE

(71) Applicant: Samsung Display Co., Ltd., Yongin-Si (KR)

(72) Inventors: Youngchan Kim, Incheon (KR); Jinoh Kwag, Yongin-si (KR); Jeongwoo Park, Yongin-si (KR); Jaeho You, Gwangmyeong-si (KR); Mingyeong Jo, Suwon-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 17/533,624

(22) Filed: Nov. 23, 2021

(65) Prior Publication Data
US 2022/0291780 A1 Sep. 15, 2022

(30) Foreign Application Priority Data
Mar. 12, 2021 (KR) .................. 10-2021-0032770

(51) Int. Cl.
*G06F 3/044* (2006.01)
*H01L 27/32* (2006.01)
*G06F 3/041* (2006.01)
*H01L 51/52* (2006.01)

(52) U.S. Cl.
CPC .......... *G06F 3/0446* (2019.05); *G06F 3/0412* (2013.01); *H01L 27/323* (2013.01); *H01L 27/3232* (2013.01); *H01L 51/5284* (2013.01); *G06F 2203/04112* (2013.01)

(58) Field of Classification Search
CPC .................................................. G06F 3/0446
See application file for complete search history.

(56) References Cited

U.S. PATENT DOCUMENTS

| 9,857,924 B2* | 1/2018 | Xu ..................... G06F 3/0446 |
| 2008/0002110 A1* | 1/2008 | Choi ..................... G02F 1/15 349/106 |
| 2010/0201242 A1 | 8/2010 | Liu et al. |
| 2013/0050798 A1 | 2/2013 | Kim et al. |
| 2017/0048516 A1* | 2/2017 | Yang ..................... H01L 27/323 |
| 2017/0139222 A1* | 5/2017 | Yang ..................... G02F 1/163 |

FOREIGN PATENT DOCUMENTS

| KR | 101206285 B1 | 11/2012 |
| KR | 101268954 B1 | 5/2013 |
| KR | 101357041 B1 | 2/2014 |
| KR | 1020170026017 A | 3/2017 |
| KR | 1020200017622 A | 2/2020 |

* cited by examiner

*Primary Examiner* — Robin J Mishler
(74) *Attorney, Agent, or Firm* — Cantor Colburn LLP

(57) ABSTRACT

A display device includes a display unit, an upper electrode layer, a lower electrode layer and an electrochromic layer. The display unit includes a plurality of light emitting diodes disposed in a light emitting area. The upper electrode layer is disposed on the display unit, and includes a plurality of first electrode patterns and a plurality of second electrode patterns. The first electrode patterns are arranged in a first direction, and are electrically connected each other. The second electrode patterns are arranged in a second direction intersecting the first direction and are electrically connected each other. The lower electrode layer is disposed between the upper electrode layer and the display unit. The electrochromic layer is disposed between the upper electrode layer and the lower electrode layer, and includes an electrochromic pattern.

20 Claims, 11 Drawing Sheets

DISPLAY DEVICE

This application claims priority to Korean Patent Application No. 10-2021-0032770, filed on Mar. 12, 2021, and all the benefits accruing therefrom under 35 U.S.C. § 119, the content of which in its entirety is herein incorporated by reference.

BACKGROUND

1. Field

Embodiments relate to a display device.

2. Description of the Related Art

A display device is a device that displays an image for providing visual information to a user. Among display devices, an organic light emitting diode ("OLED") display has recently been attracting attention.

In general, a display device is manufactured to implement a wide viewing angle, but it may be desired to temporarily implement a display device with a narrow viewing angle so that only the user can see an image on the screen in a public place.

Conventionally, a light path blocking film or the like may be attached to the display device to implement the display device with a narrow viewing angle. When the light path blocking film is attached to the display device, a thickness of the display device may be increased, and portability of the display device may be reduced.

SUMMARY

Embodiments provide a display device capable of adjusting a viewing angle.

An embodiment of a display device includes a display unit, an upper electrode layer, a lower electrode layer and an electrochromic layer. In such an embodiment, the display unit includes a plurality of light emitting diodes disposed in a light emitting area. In such an embodiment, the upper electrode layer is disposed on the display unit, and includes a plurality of first electrode patterns and a plurality of second electrode patterns. In such an embodiment, the first electrode patterns are arranged in a first direction, and are electrically connected each other. In such an embodiment, the second electrode patterns are arranged in a second direction intersecting the first direction and are electrically connected each other. In such an embodiment, the lower electrode layer is disposed between the upper electrode layer and the display unit. In such an embodiment, the electrochromic layer is disposed between the upper electrode layer and the lower electrode layer, and includes an electrochromic pattern.

In an embodiment, the first electrode patterns and the second electrode patterns may overlap the electrochromic pattern.

In an embodiment, the lower electrode layer may overlap the display device, entirely.

In an embodiment, each of the first electrode patterns and the second electrode patterns may have a mesh shape.

In an embodiment, the first electrode patterns and the second electrode patterns may collectively define a touch sensor unit.

In an embodiment, the electrochromic layer may be converted to a wide viewing angle mode and a narrow viewing angle mode based on a voltage applied thereto, and the electrochromic pattern may not be discolored in the wide viewing angle mode, and is discolored in the narrow viewing angle mode.

In an embodiment, the lower electrode layer may receive a same voltage as a voltage that is applied to the first electrode patterns in the wide viewing angle mode, and the lower electrode layer may receive a different voltage from a voltage that is applied to the first electrode patterns in the narrow viewing angle mode.

In an embodiment, the electrochromic pattern may be discolored when a voltage difference between the upper electrode layer and the lower electrode layer exists.

In an embodiment, the first electrode patterns may receive a first voltage and the second electrode patterns may periodically receive a second voltage different from the first voltage.

In an embodiment, the electrochromic pattern may overlap the first electrode patterns and may not overlap the second electrode patterns.

In an embodiment, the display device may further include a black matrix disposed in a light shielding area which surrounds the light emitting area, and the electrochromic pattern may overlap the black matrix.

In an embodiment, the electrochromic layer may include a first area which overlaps the light emitting area and a second area which overlaps the light shielding area, and the electrochromic pattern may be disposed in the second area.

In an embodiment, the second area may include an electrochromic material, and the first area may include a material which is not discolored when a voltage is applied thereto.

In an embodiment, the first area and the second area may include an electrochromic material.

In an embodiment, the electrochromic pattern may include a first electrochromic pattern which overlaps the light emitting area and a second electrochromic pattern which overlaps the black matrix.

In an embodiment, the lower electrode layer may include a first lower electrode pattern which overlaps the first electrochromic pattern and a second lower electrode pattern which overlaps the second electrochromic pattern.

In an embodiment, the electrochromic layer may include an electrochromic material in a portion which overlaps the first lower electrode pattern.

In an embodiment, the first electrochromic pattern may include one or more sub-patterns, and at least one sub-pattern of the sub-patterns may be discolored.

In an embodiment, a width of each of the sub-patterns may be less than a width of the second electrochromic pattern.

In an embodiment, the electrochromic layer may be converted to a wide viewing angle mode, a first narrow viewing angle mode, and a second narrow viewing angle mode based on a voltage applied thereto, the first electrochromic pattern may not be discolored and the second electrochromic pattern may be discolored in the first narrow viewing angle mode, and the first electrochromic pattern and the second electrochromic pattern may be discolored in the second narrow viewing angle mode.

In embodiments of the invention, the display device may include an upper electrode layer which defines a touch sensor unit, a lower electrode layer, and the electrochromic layer between the upper electrode layer and the lower electrode layer. In such embodiments, the upper electrode layer may be an electrode for applying a voltage to the electrochromic layer, and may also be a touch sensor for sensing an external touch. In such embodiments, the electrochromic layer may include an electrochromic pattern that is discolored when the voltage is applied. Accordingly, a viewing angle of the display device may be adjusted without attaching a separate light path blocking film, such that portability of the display device may be improved. In such embodiments, since only light having the viewing angle greater than or equal to a certain angle among light emitted from a light emitting diode of the display device is blocked, a resolution of the display device may not be deteriorated.

DETAILED DESCRIPTION

Figure 1:
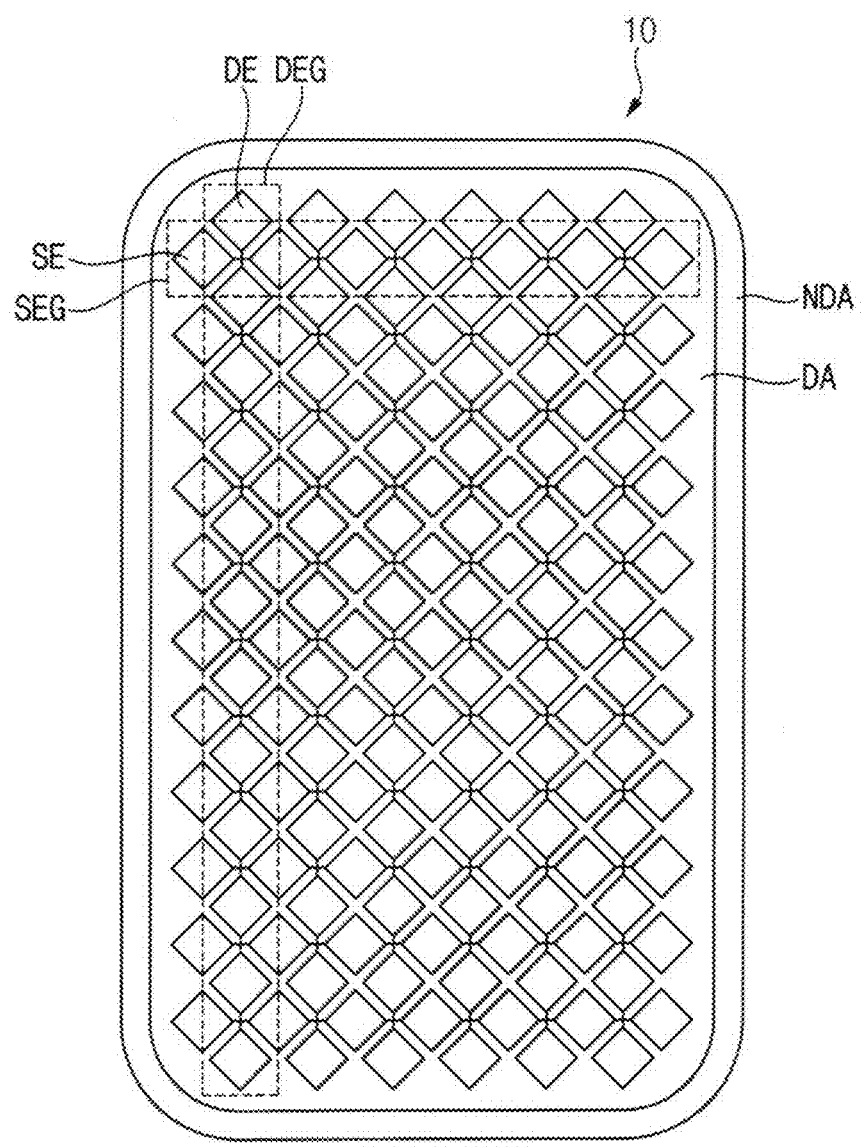
FIG. 1 is a plan view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, embodiments of a display device will be described in detail with reference to the accompanying drawings. The same or like reference numerals are used to indicate the same or like elements in the drawings, and any repetitive detailed descriptions thereof will be omitted or simplified.

Figure 2:
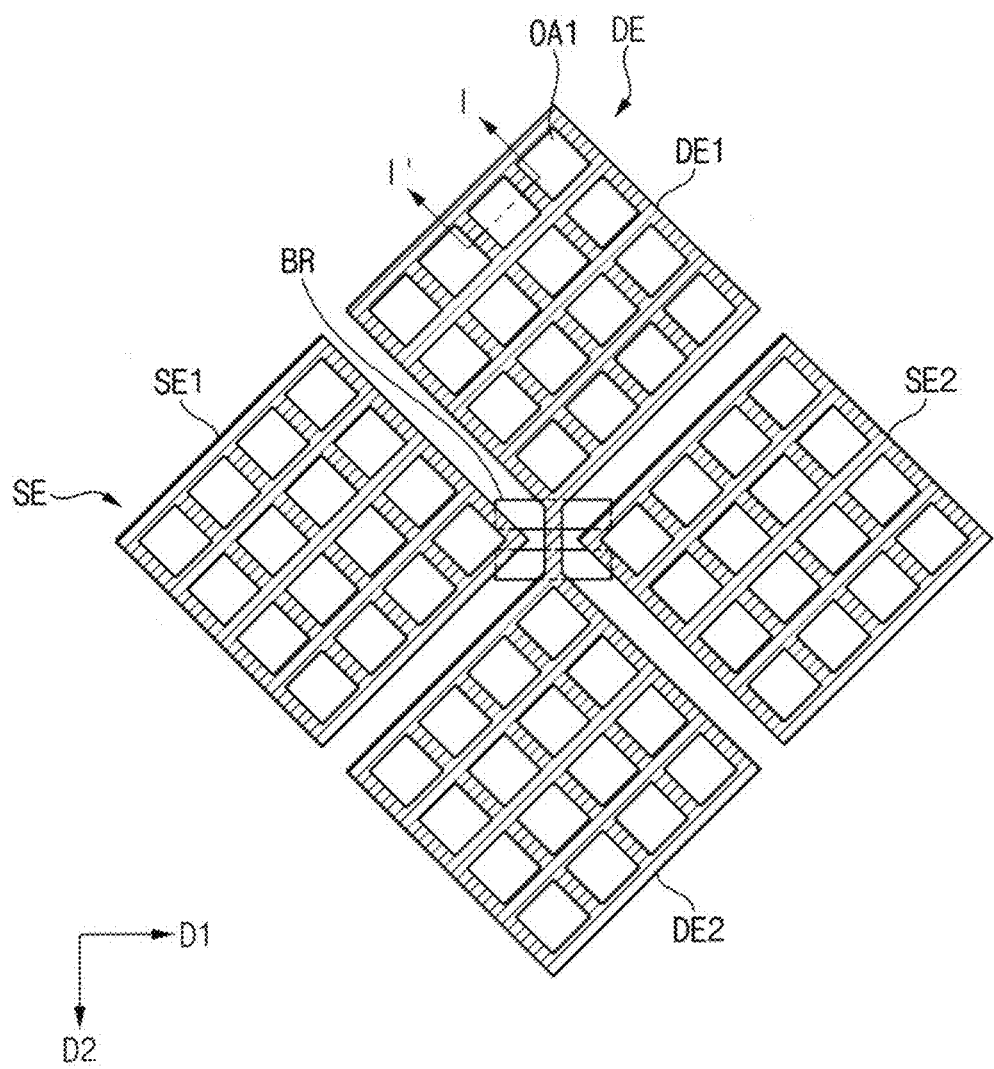
FIG. 2 is an enlarged plan view of first electrode patterns and second electrode patterns of a touch sensor unit of a display device according to an embodiment of the invention.
Figure 3:
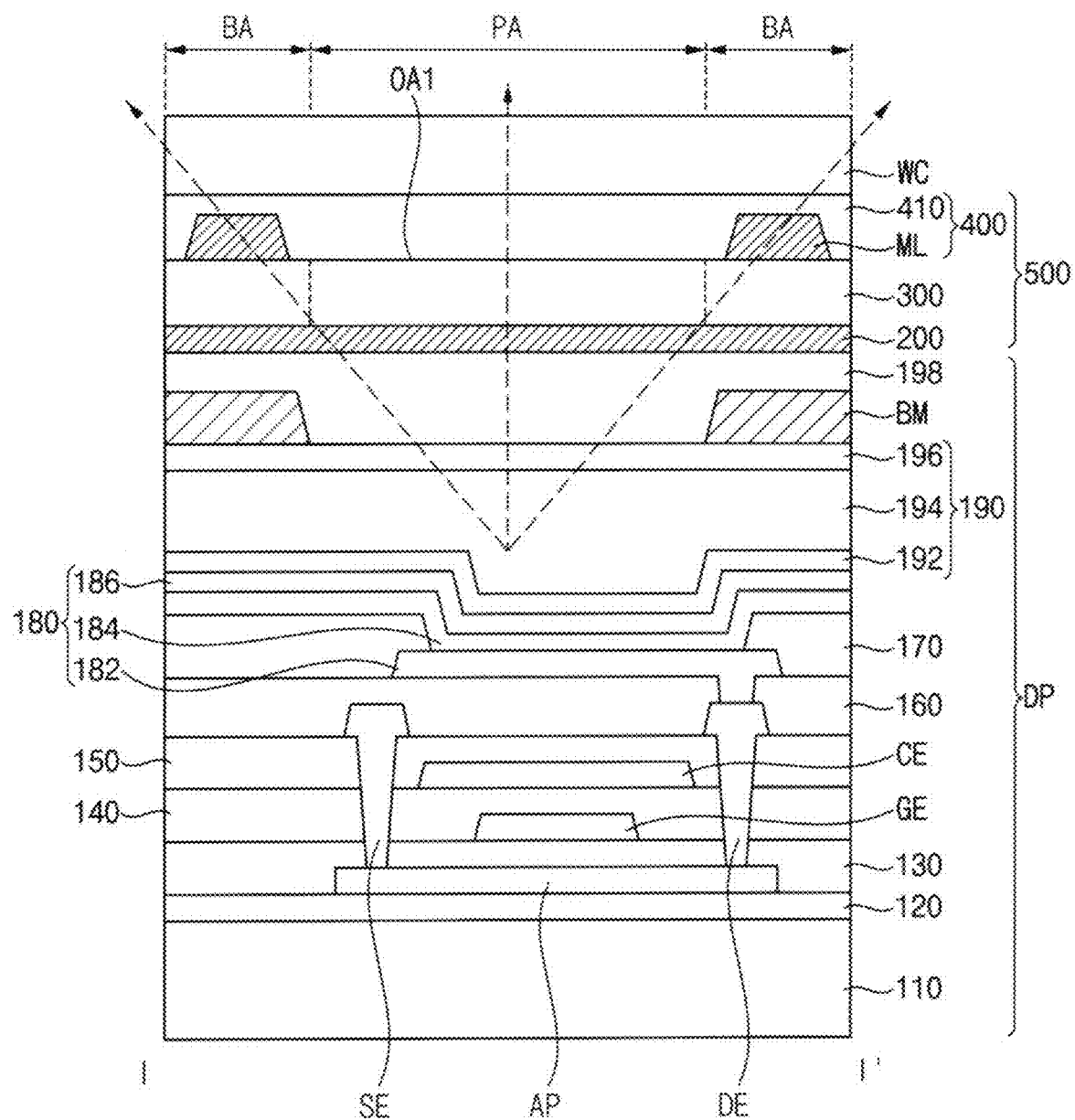
FIG. 3 is a cross-sectional view taken along line I-I' of FIG. 2.

FIG. 1 is a plan view of a display device according to an embodiment. FIG. 2 is an enlarged plan view of first electrode patterns and second electrode patterns of a touch sensor unit of a display device according to an embodiment of the invention. FIG. 3 is a cross-sectional view taken along line I-I' of FIG. 2.

Referring to FIGS. 1 to 3, an embodiment of a display device 10 may include a display area DA and a peripheral area NDA. Pixels may be arranged in the display area DA to display an image. The peripheral area NDA may be an area that is adjacent to the display area DA and does not display the image. In one embodiment, for example, the peripheral area NDA may surround the display area DA.

The display area DA may include a light emitting area PA and a light blocking area BA. The light blocking area BA may surround the light emitting area PA. The light emitting area PA may be an area in which light is emitted, and the light blocking area BA may be an area in which light is not emitted.

The display device 10 may include a touch sensor unit. The touch sensor unit may be disposed in the display area DA. In one embodiment, for example, the touch sensor unit may sense an external input by a capacitive manner.

In an embodiment, the touch sensor unit may include electrodes for sensing a change in capacitance. In one embodiment, for example, the touch sensor unit may include a first electrode pattern group SEG extending along a first direction D1 and a second electrode pattern group DEG extending along a second direction D2 crossing the first direction D1. The first electrode pattern group SEG may include first electrode patterns SE arranged in the first direction D1. The first electrode patterns SE may be electrically connected to each other. In one embodiment, for example, the first electrode patterns SE may be referred to as Rx electrodes. The second electrode pattern group DEG may include second electrode patterns DE arranged in the second direction D2. The second electrode patterns DE may be electrically connected to each other. In one embodiment, for example, the second electrode patterns DE may be referred to as Tx electrodes. In such an embodiment, the first electrode patterns SE and the second electrode patterns DE may compose or collectively define the touch sensor unit.

In an embodiment, the first electrode patterns SE and the second electrode patterns DE may be disposed in or directly on a same layer. In one embodiment, for example, the second electrode patterns DE may be continuously connected or integrally formed with each other as a single unitary unit. The first electrode patterns SE may be spaced apart by the second electrode pattern group DEG and may be electrically connected to each other by a connection pattern BR disposed in or directly on a different layer from the first electrode patterns SE.

In one embodiment, for example, as illustrated in FIG. 2, the second electrode patterns DE1 and DE2 arranged in the second direction D2 may be continuously connected or integrally formed with each other as a single unitary unit. The first electrode patterns SE1 and SE2 may be spaced apart from each other in the first direction D1 and may be electrically connected by the connection pattern BR. According to an embodiment, a plurality of connection patterns BR may be provided, but embodiments of the invention are not limited thereto, and alternatively, the connection pattern BR may be provided as a single pattern.

In one embodiment, for example, the second electrode patterns DE and the first electrode patterns SE may be referred to as a first conductive pattern, and the connection pattern BR may be referred to as a second conductive pattern.

In one embodiment, for example, each of the first conductive pattern and the second conductive pattern may include at least one selected from a metal, a metal oxide, a conductive polymer, graphene, carbon nanotubes, etc. In one embodiment, for example, the metal may include molybdenum, silver, titanium, copper, aluminum, or an alloy thereof. In one embodiment, for example, the metal may be provided in a form of a continuous thin film or a nanowire. In one embodiment, for example, the metal oxide may include at least one selected from indium tin oxide ("ITO"), indium zinc oxide ("IZO"), zinc tin oxide ("ZTO"), indium oxide, zinc oxide, tin oxide, or a combination thereof. Each of the first conductive pattern and the second conductive pattern may have a single layer structure or a multilayer structure, in which each layer includes different materials from each other.

According to an embodiment, each of the first electrode patterns SE and the second electrode patterns DE may have a mesh shape. In one embodiment, for example, each of the first electrode patterns SE and the second electrode patterns DE may have an opening area OA1. The opening area OA1 may overlap the light emitting area PA of each pixel. Accordingly, a transmittance of the display device 10 may be improved even in a narrow viewing angle mode.

Hereinafter, a cross-sectional structure of an embodiment of the display device 10 will be described. Referring to FIG. 3, according to an embodiment, the display device 10 may include a display unit DP, an electrochromic device 500, and a window cover WC. Hereinafter, an embodiment of the display unit DP will be described in detail.

In an embodiment of the display unit DP, a buffer layer 120 may be disposed on a base substrate 110. An active pattern AP may be disposed on the buffer layer 120.

In one embodiment, for example, the base substrate 110 may include at least one selected from glass, quartz, sapphire, a polymer material, etc. According to an embodiment, the base substrate 110 may be a flexible substrate that includes a polymer material. In one embodiment, for example, the polymer material may include at least one selected from polyethylene terephthalate, polyethylene naphthalate, polyether ketone, poly carbonate, polyarylate, polyethersulfone, polyimide, etc.

The buffer layer 120 may reduce or block penetration of foreign matter, moisture, or external air from a lower portion of the base substrate 110, and may flatten an upper surface of the base substrate 110. In one embodiment, for example, the buffer layer 120 may include an inorganic material such as oxide or nitride.

A first gate metal pattern that includes a gate electrode GE may be disposed on the active pattern AP, and a first insulation layer 130 may be disposed between the active pattern AP and the gate electrode GE.

A second gate metal pattern that includes a capacitor electrode pattern CE may be disposed on the gate electrode GE. The capacitor electrode pattern CE may include a capacitor electrode for forming a capacitor, a wiring for transmitting various signals, etc.

A second insulation layer 140 may be disposed between the gate electrode GE and the capacitor electrode pattern CE. A third insulation layer 150 may be disposed on the capacitor electrode pattern CE.

In an embodiment, the active pattern AP may include silicon or a metal oxide semiconductor. In one embodiment, for example, the active pattern AP may include polycrystalline silicon (polysilicon), and may be doped with an N-type impurity or a P-type impurity.

In an alternative embodiment, the active pattern may include a metal oxide semiconductor. In one embodiment, for example, the active pattern may include at least one selected from a binary compound (ABx), a ternary compound (ABxCy), a quaternary compound (ABxCyDz), etc., that includes indium (In), zinc (Zn), gallium (Ga), tin (Sn), titanium (Ti), aluminum (Al), hafnium (Hf), zirconium (Zr), magnesium (Mg), etc. In one embodiment, for example, the second active pattern AP2 may include at least one selected from zinc oxide (ZnOx), gallium oxide (GaOx), titanium oxide (TiOx), tin oxide (SnOx), indium oxide (InOx), indium gallium oxide ("IGO"), IZO, ITO, gallium zinc oxide ("GZO"), zinc magnesium oxide ("ZMO"), ZTO, zinc zirconium oxide (ZnZrxOy), indium gallium zinc oxide ("IGZO"), indium zinc tin oxide ("IZTO"), indium gallium hafnium oxide ("IGHO"), tin aluminum-zinc oxide ("TAZO") and indium gallium tin oxide ("IGTO"), etc. Zinc oxide (ZnOx) may be ZnO, and/or ZnO2.

The first insulation layer 130, the second insulation layer 140, and the third insulation layer 150 may include silicon oxide (SiOx), silicon nitride (SiNx), silicon carbide, or a combination thereof and may include an insulating metal oxide such as aluminum oxide, tantalum oxide, hafnium oxide, zirconium oxide, or titanium oxide. In one embodiment, for example, each of the first insulation layer 130, the second insulation layer 140, and the third insulation layer 150 may have a single layer or multilayer structure of silicon nitride or silicon oxide, and may have a different structure from each other.

The gate electrode GE and the capacitor electrode pattern CE may include at least one selected from a metal, a metal alloy, a metal nitride, a conductive metal oxide, etc. In one embodiment, for example, the gate electrode GE and the capacitor electrode pattern CE may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof and may include a single layer or a multilayer structure that includes different metal layers.

A first source metal pattern may be disposed on the third insulation layer 150. The first source metal pattern may include a source electrode SE and a drain electrode DE in electrical contact with the active pattern AP. Each of the source electrode SE and the drain electrode DE may penetrate a lower insulation layer to contact the active pattern AP.

The first source metal pattern may include at least one selected from a metal, a metal alloy, a metal nitride, a conductive metal oxide, etc. In one embodiment, for example, the first source metal pattern may include gold (Au), silver (Ag), aluminum (Al), copper (Cu), nickel (Ni), platinum (Pt), magnesium (Mg), and chromium (Cr), tungsten (W), molybdenum (Mo), titanium (Ti), tantalum (Ta), or an alloy thereof, and may have a single layer or a multilayer structure that includes different metal layers. According to an embodiment, the first source metal pattern may have a multilayer structure that includes aluminum.

A fourth insulation layer 160 may be disposed on the first source metal pattern. The fourth insulation layer 160 may include an organic material. In one embodiment, for example, the fourth insulation layer 160 may include an organic insulating material such as a phenol resin, an acrylic resin, a polyimide resin, a siloxane resin, or an epoxy resin.

A light emitting diode 180 may be disposed on the fourth insulation layer 160. The light emitting diodes 180 may be disposed in the light emitting area PA. The light emitting diode 180 may include a first electrode 182 in electrical contact with the drain electrode DE, an organic light emitting layer 184 disposed on the first electrode 182, and a second electrode 186 disposed on the organic light emitting layer 184. The organic light emitting layer 184 of the light emitting diode 180 may be disposed in an opening of the pixel defining layer 170 disposed on the fourth insulation layer 160. The first electrode 182 may be a lower electrode of the light emitting diode 180, and the second electrode 186 may be an upper electrode of the light emitting diode 180.

The first electrode 182 may act as an anode. In one embodiment, for example, the first electrode 182 may be a transmissive electrode or a reflective electrode depending on the light emission type. In an embodiment where the first electrode 182 is a transparent electrode, the first electrode 182 may include at least one selected from ITO, IZO, ZTO, indium oxide, zinc oxide, tin oxide, etc. In an embodiment where the first electrode 182 is a reflective electrode, the first electrode 182 may include at least one selected from gold (Au), silver (Ag), aluminum (Al), copper (Cu), nickel (Ni), platinum (Pt), magnesium (Mg), chromium (Cr), tungsten (W), molybdenum (Mo), titanium (Ti), etc., and may have a stacked structure with a material used for the transparent electrode.

An opening may be defined through the pixel defining layer 170 to overlap at least a portion of the first electrode 182. In one embodiment, for example, the pixel defining layer 170 may include an organic insulating material.

The organic light emitting layer 184 may include at least one selected from functional layers such as a hole injection layer, a hole transport layer, an organic light emitting layer, an electron transport layer, and an electron injection layer. In an embodiment, the organic light emitting layer 184 may be a single layer or multilayer structure. The organic light emitting layer 184 may include a low molecular weight organic compound or a high molecular weight organic compound.

In an embodiment, the organic light emitting layer 184 may emit red, green, or blue light. In an alternative embodiment, the organic light emitting layer 184 emits white light, and the organic light-emitting layer 184 may include a multilayer structure that includes a red light emitting layer, a green light emitting layer, and a blue light emitting layer. However, embodiments of the invention are not limited thereto, and the organic light emitting layer 184 may include a single layer structure that includes a red, green, and blue light-emitting material.

In an embodiment, the second electrode 186 may be a transmissive electrode or a reflective electrode depending on a light emission type of the display device. In one embodiment, for example, the second electrode 186 may include a metal, an alloy, a metal nitride, a metal fluoride, a conductive metal oxide, or a combination thereof.

In one embodiment, for example, at least a portion of the second electrode 186 and the organic light emitting layer 184 may be formed as a common layer continuously extending over a plurality of pixels on the display area. However, embodiments of the invention are not limited thereto, and the organic light emitting layer 184 may include a plurality of patterns that corresponds to each pixel and spaced apart from each other.

An encapsulation layer 190 may be disposed on the light emitting diode 180. The encapsulation layer 190 may have a stacked structure of an organic thin film and an inorganic thin film. In one embodiment, for example, the encapsulation layer 190 may include a first inorganic thin film 192, an organic thin film 194 disposed on the first inorganic thin film, and a second inorganic thin film 196 disposed on the organic thin film 194. However, embodiments of the invention are not limited thereto, and the encapsulation layer 190 may include at least two organic thin films and at least three inorganic thin films.

A black matrix BM and an overcoat layer 198 that covers the black matrix BM and includes an organic material may be disposed on the encapsulation layer 190. The black matrix BM may be disposed in the light blocking area BA. The overcoat layer 198 may be referred to as a low dielectric layer. The black matrix BM may prevent light from being emitted to the outside.

An electrochromic device 500 may be disposed on the display unit DP. The electrochromic device 500 may include an upper electrode layer 400, an electrochromic layer 300, and a lower electrode layer 200.

A window cover WC may be disposed on the electrochromic device 500. The window cover WC may include a rigid material such as glass, a polymer film, or a combination thereof.

An adhesive layer or a light functional layer may be disposed between the electrochromic device 500 and the window cover WC. The light functional layer may compensate for a refractive index, act as a polarizing layer, and block ultraviolet ("UV") light. Hereinafter, an embodiment of the electrochromic device 500 will be described in greater detail.

Figure 4:
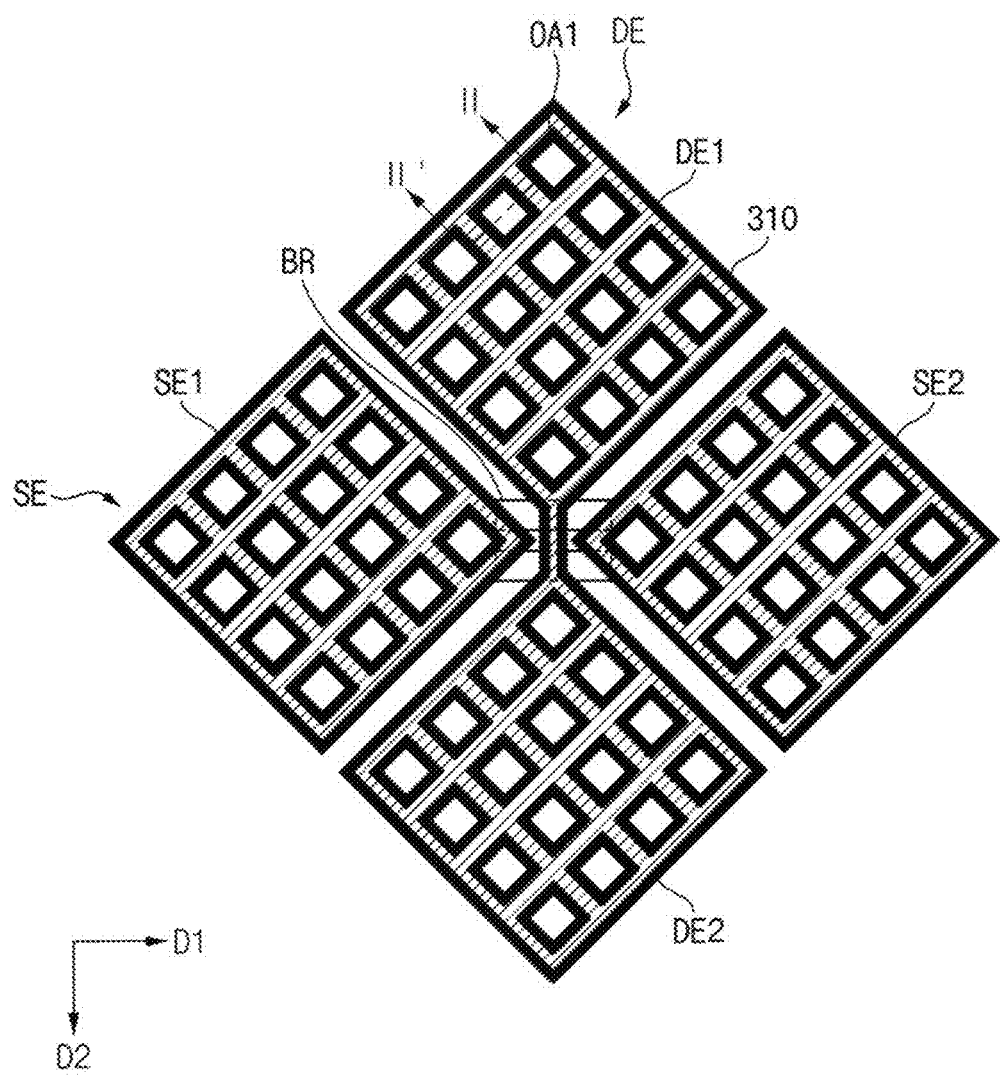
FIG. 4 is an enlarged plan view that illustrates first electrode patterns and second electrode patterns of a touch sensor unit in a narrow viewing angle mode of a display device according to an embodiment of the invention.
Figure 5:
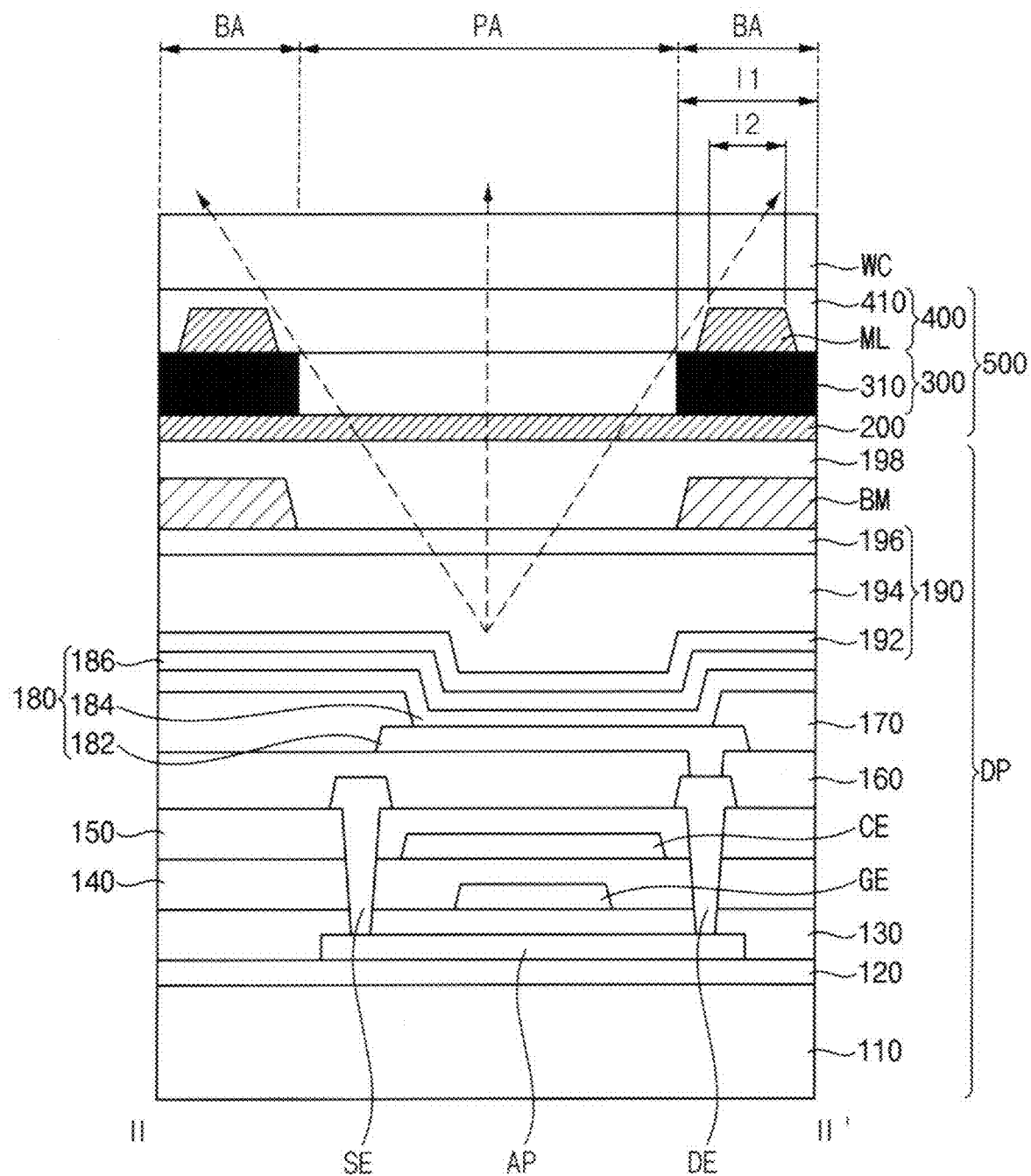
FIG. 5 is a cross-sectional view taken along line II-II' of FIG. 4.

FIG. 4 is an enlarged plan view that illustrates first electrode patterns and second electrode patterns of a touch sensor unit in a narrow viewing angle mode of a display device according to an embodiment of the invention. FIG. 5 is a cross-sectional view taken along line II-II' of FIG. 4. Particularly, FIGS. 2 to 5 may be figures that illustrate a method of operating the electrochromic device 500 of the display device 10. FIGS. 2 and 3 may illustrate a state in which the electrochromic pattern 310 that is included in the display device 10 of FIG. 1 is not discolored. That is, FIGS. 2 and 3 may illustrate a case in which the display device 10 is in a wide viewing angle mode (Normal Mode in FIG. 6). FIGS. 4 and 5 may illustrate a discolored state of the electrochromic pattern 310 included in the display device 10 of FIG. 1. That is, FIGS. 4 and 5 may illustrate a case in which the display device 10 is in a narrow viewing angle mode (PRIVATE MODE in FIG. 6).

Referring to FIGS. 2 to 5, in an embodiment, the upper electrode layer 400 may be disposed on the display unit DP. The upper electrode layer 400 may include the touch sensor unit. In such an embodiment, the upper electrode layer 400 may include first electrode patterns SE and second electrode patterns DE. The upper electrode layer 400 may include a conductive pattern ML that forms the first electrode pattern group SEG or the second electrode pattern group DEG of the touch sensor unit. A voltage may be applied to the conductive pattern ML of the touch sensor unit to sense touch. The upper electrode layer 400 may include a protective layer 410 disposed on the conductive pattern ML. The protective layer 410 may include an inorganic material. The protective layer 410 may include silicon oxide, silicon nitride, silicon oxynitride, or a combination thereof, and may have a single layer structure or a multilayer structure. The upper electrode layer 400 may be transparent because light generated from the light emitting diode 180 may pass therethrough.

The lower electrode layer 200 may be disposed between the upper electrode layer 400 and the display unit DP. The lower electrode layer 200 may overlap the entire display unit DP. In such an embodiment, in a process of forming the lower electrode layer 200, a patterning process may not be performed thereon. Therefore, a manufacturing process may be simplified. However, the invention is not limited thereto, and in an alternative embodiment, the patterning process may be performed when the lower electrode layer 200 is formed.

The electrochromic layer 300 may be disposed between the upper electrode layer 400 and the lower electrode layer 200. The electrochromic layer 300 may include an electrochromic pattern 310. The electrochromic pattern 310 may overlap the black matrix BM. The electrochromic pattern 310 may be a portion of the electrochromic layer 300 that is discolored in a narrow viewing angle mode to be described later.

The electrochromic layer 300 may be converted into a wide viewing angle mode and a narrow viewing angle mode according to an applied voltage or a voltage (or an electric field) applied thereto. The electrochromic layer 300 may be selectively in a wide viewing angle mode or a narrow viewing angle mode based on a voltage difference between the upper electrode layer 400 and the lower electrode layer 200. In the wide viewing angle mode, the electrochromic pattern 310 may not be discolored. Accordingly, in the wide viewing angle mode, light generated from the light emitting diode 180 may pass through the electrochromic device 500. Accordingly, a significant amount of light generated from the light emitting diode 180 may be transmitted. In the narrow viewing angle mode, the electrochromic pattern 310 may be discolored. In the narrow viewing angle mode, the electrochromic device 500 may absorb the light generated from the light emitting diode 180. Accordingly, a viewing angle greater than a predetermined angle may be blocked.

When the electrochromic pattern 310 is discolored in the narrow viewing angle mode, the electrochromic pattern 310 may be in an opaque state as shown in FIG. 5. When the electrochromic pattern 310 is not discolored in the wide viewing angle mode, the electrochromic pattern 310 may be in a transparent state as shown in FIG. 3.

The electrochromic pattern 310 may overlap the first electrode patterns SE and the second electrode patterns DE. In such an embodiment, the electrochromic pattern 310 may overlap the conductive pattern ML. The electrochromic pattern 310 may be disposed between the first and second electrode patterns SE, DE and the lower electrode layer 200.

The electrochromic pattern 310 may be discolored when a voltage difference is generated between the upper electrode layer 400 and the lower electrode layer 200. In such an embodiment, a voltage may be applied to the electrochromic layer 300 due to the voltage difference between the lower electrode layer 200 and the first electrode patterns SE. Accordingly, the electrochromic pattern 310 of the electrochromic layer 300 may be discolored.

A width l1 of the electrochromic pattern 310 may be greater than a width l2 of the conductive pattern ML. The width l1 of the electrochromic pattern 310 may be less than about 1.2 times the width l2 of the conductive pattern ML. In such an embodiment, the width l1 of the electrochromic pattern 310 may be in a range of about 1 to about 1.2 times the width l2 of the conductive pattern ML. If the width l1 of the electrochromic pattern 310 is greater than the width l2 of the conductive pattern ML, the viewing angle may be further narrower in the narrow viewing angle mode. However, embodiments according to the invention are not limited thereto, and in alternative embodiments, the width l1 of the electrochromic pattern 310 may be smaller than the width l2 of the conductive pattern ML. In another alternative embodiment, the width l1 of the electrochromic pattern 310 may be about 1.2 times or greater the width l2 of the conductive pattern ML.

Figure 6:
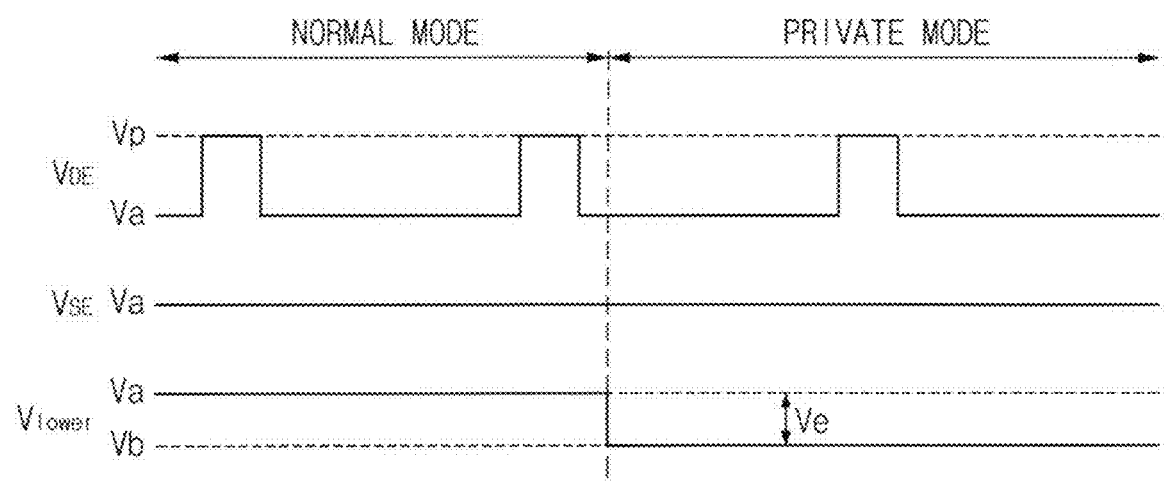
FIG. 6 is a timing diagram that illustrates voltage driving of a display device according to an embodiment.

FIG. 6 is a timing diagram that illustrates voltage driving of a display device according to an embodiment. Particularly, FIG. 6 may illustrate voltages applied to each of the first electrode patterns SE, the second electrode patterns DE, and the lower electrode layer 200 in the wide viewing angle mode and the narrow viewing angle mode.

Referring to FIGS. 4 to 6, the first electrode patterns SE may receive a first voltage Va. In such an embodiment, a constant voltage may be applied to the first electrode patterns SE in the wide viewing angle mode (NORMAL MODE) and the narrow viewing angle mode (PRIVATE MODE). The second electrode patterns DE may periodically receive a second voltage Vp that is different from the first voltage Va in the wide viewing angle mode and the narrow viewing angle mode. The voltage $V_{DE}$ applied to the second electrode patterns DE or the second voltage Vp may be a pulse signal. In such an embodiment, a same voltage as that of the first electrode patterns SE is applied to the second electrode patterns DE, but the second voltage Vp that is different from the first voltage Va is periodically applied only for a predetermined time. The second voltage Vp may be periodically applied to the second electrode patterns DE, and the first electrode patterns SE may sense a change in voltage of the second electrode patterns DE. Accordingly, the touch sensor unit that includes the first electrode patterns SE and the second electrode patterns DE may sense a touch event thereon.

The lower electrode layer 200 may receive the first voltage Va that is a same voltage as the voltage $V_{SE}$ applied to the first electrode patterns SE in the wide viewing angle mode. The voltage $V_{lower}$ applied to the lower electrode layer 200 may be the first voltage Va in the wide viewing angle mode. The lower electrode layer 200 may receive a third voltage Vb that is different from the voltage applied to the first electrode patterns SE in the narrow viewing angle mode.

In such an embodiment, when the lower electrode layer 200 receives the first voltage Va in the wide viewing angle mode, there may be no voltage difference between the lower electrode layer 200 and the upper electrode layer 400. When there is no voltage difference between the lower electrode layer 200 and the upper electrode layer 400, no voltage may be applied to the electrochromic pattern 310.

In this case, a voltage difference between the lower electrode layer 200 and the upper electrode layer 400 by the second voltage Vp may exist. Accordingly, application time of the second voltage Vp may be minimized so that the electrochromic pattern 310 is not discolored due to the voltage difference.

When the lower electrode layer 200 receives the third voltage Vb in the narrow viewing angle mode, a voltage difference Ve may exist between the lower electrode layer 200 and the upper electrode layer 400. When the voltage difference Ve exists between the lower electrode layer 200 and the upper electrode layer 400, a voltage may be applied to the electrochromic pattern 310. When the voltage is applied to the electrochromic pattern 310, the electrochromic pattern 310 may be discolored.

Embodiments of the voltage driving of the display device 10 are described above with reference to FIGS. 3 to 6, but the driving method of the electrochromic pattern 310 of the display device 10 may be variously changed. In one alternative embodiment, for example, the electrochromic pattern 310 of the display device 10 may be discolored based on current driving. In such an embodiment, the width l1 of the electrochromic pattern 310 may be substantially identical to the width l2 of the conductive pattern ML.

Referring to FIGS. 4 and 5, in an embodiment, the display device 10 may have a discolored pattern in the first direction D1 and the second direction D2. Accordingly, both a viewing angle in the first direction D1 and a viewing angle in the second direction D2 may be narrowed.

In an embodiment, since the display device 10 includes an upper electrode layer 400 that includes the touch sensor unit, and the electrochromic layer 300 that is disposed between the upper electrode layer 400 and the lower electrode layer 200, the display device 10 may be converted to the wide viewing angle mode or the narrow viewing angle mode. Accordingly, the user may convert the mode of the display device 10 based on environment and purpose. In such an embodiment, since the touch sensor unit is included in the upper electrode layer 400 and additional components such as a light path blocking film are not included, a thickness of the display device 10 may be reduced. Accordingly, portability and security of the display device 10 may be improved.

In such an embodiment, when the display device 10 is in the narrow viewing angle mode, only a portion of the light emitted from each of the light emitting diodes 180 that has a viewing angle greater than or equal to a certain angle may be blocked, and the other portion that has a viewing angle less than the certain angle may be emitted to the outside of the display device 10. Accordingly, the resolution of the display device 10 may not be reduced even in the narrow viewing angle mode.

Figure 7:
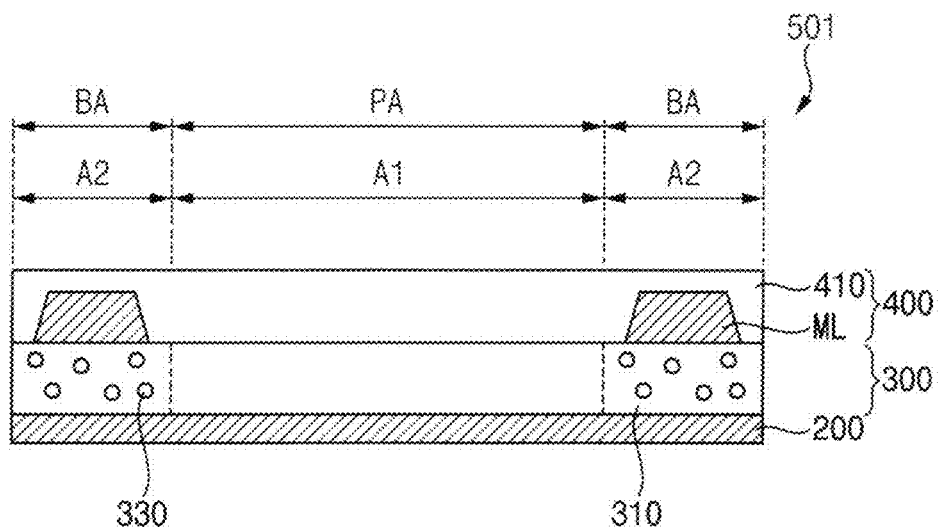
FIG. 7 is a cross-sectional view that illustrates an embodiment of an electrochromic device included in a display device of the invention.

FIG. 7 is a cross-sectional view that illustrates an embodiment of an electrochromic device 501 included in a display device of the invention.

Referring to FIGS. 3 and 7, in an embodiment, the electrochromic layer 300 may include a first area A1 that overlaps the light emitting area PA and a second area A2 that overlaps the light blocking area BA. The electrochromic pattern 310 may be disposed in the second area A2. The second area A2 may overlap the conductive pattern ML. Accordingly, the first area A1 may not receive a voltage, but the second area A2 may receive the voltage.

The second area A2 may include an electrochromic material 330. The electrochromic material 330 may be discolored when a voltage is applied thereto. In one embodiment, for example, the electrochromic material 330 may include at least one selected from $WO_3$, $NiO_xH_y$, $Nb_2O_5$, $V_2O_5$, $TiO_2$, $MoO_3$, polyaniline, etc. The first area A1 may be an insulation layer and may include a material that is not discolored even when a voltage is applied. In such an embodiment, the first area A1 may not include an electrochromic material, and thus the first area A1 may remain transparent even when the voltage is applied to the first area A1.

Figure 8:
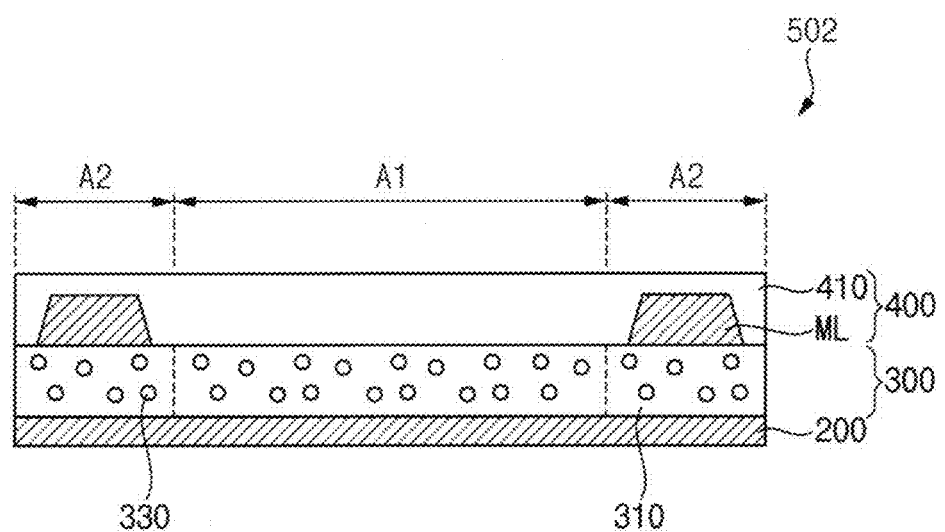
FIG. 8 is a cross-sectional view that illustrates an alternative embodiment of FIG. 7.

FIG. 8 is a cross-sectional view that illustrates another alternative embodiment of FIG. 7.

Referring to FIG. 8, in an alternative embodiment of the electrochromic device 502, the first area A1 and the second area A2 may include an electrochromic material 330. In such an embodiment, the electrochromic material 330 may also be included in the first area A1. In such an embodiment, since only the second area A2 receive a voltage, only the electrochromic pattern 310 that is disposed in the second area A2 may be discolored.

When both the first area A1 and the second area A2 include the electrochromic material 330, the first area A1 and the second area A2 may be integrally formed with each other as a single unitary unit. In such an embodiment, an additional process may not be used to form the first area A1 and the second area A2 separately, and thus a manufacturing process of the display device 10 may be simplified.

Figure 9:
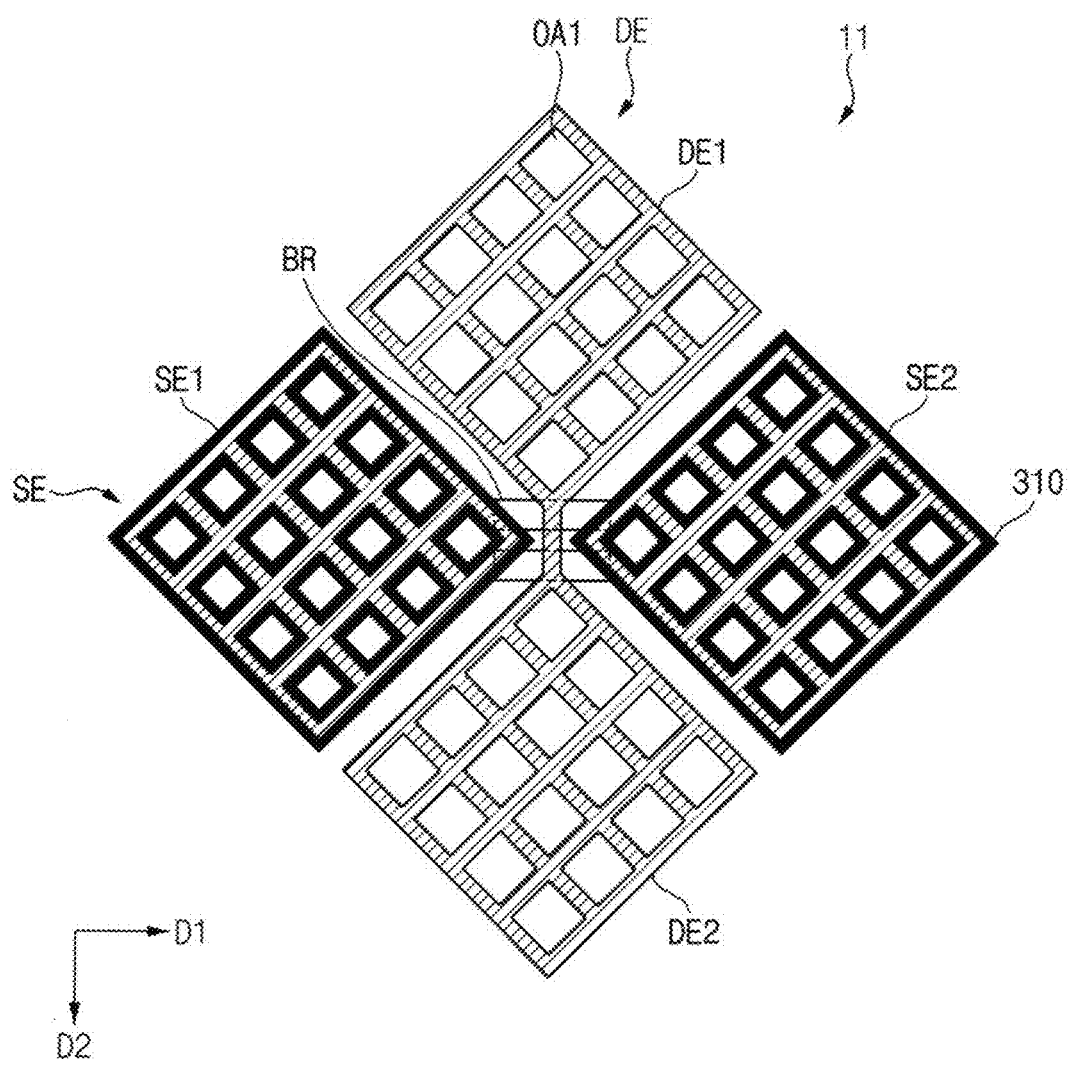
FIG. 9 is a plan view that illustrates another alternative embodiment of FIG. 2.

FIG. 9 is a plan view that illustrates an alternative embodiment of FIG. 2.

Referring to FIG. 9, in an alternative embodiment, the electrochromic pattern 310 of a display device 11 may overlap the first electrode patterns SE. However, the electrochromic pattern 310 may not overlap the second electrode patterns DE. In such an embodiment, the electrochromic pattern 310 overlaps only the first electrode patterns SE, and only a portion of the electrochromic layer 300 that overlaps the first electrode patterns SE may be discolored. However, embodiments according to the invention are not limited thereto, and alternatively, only a portion of the electrochromic layer 300 that overlaps with the second electrode patterns DE may be discolored.

The electrochromic layer 300 of the display device 11 may have a discolored pattern in the first direction D1. Accordingly, the viewing angle in the second direction D2 may be narrowed. In such an embodiment where the electrochromic pattern 310 overlaps only the first electrode patterns SE, the second voltage that is periodically applied to the second electrode patterns DE may not be considered. That is, in the wide viewing angle mode and the narrow viewing angle mode, the discoloration of the electrochromic pattern 310 may be controlled only by adjusting the voltage of the lower electrode layer 200, and the application time of the second voltage that is applied to the second electrode patterns DE may not be considered. However, embodiments according to the invention are not limited thereto, and alternatively, the electrochromic layer 300 of the display device 11 may have a discolored pattern only in the second direction D2, and the viewing angle in the first direction D1 may be narrowed.

Figure 10:
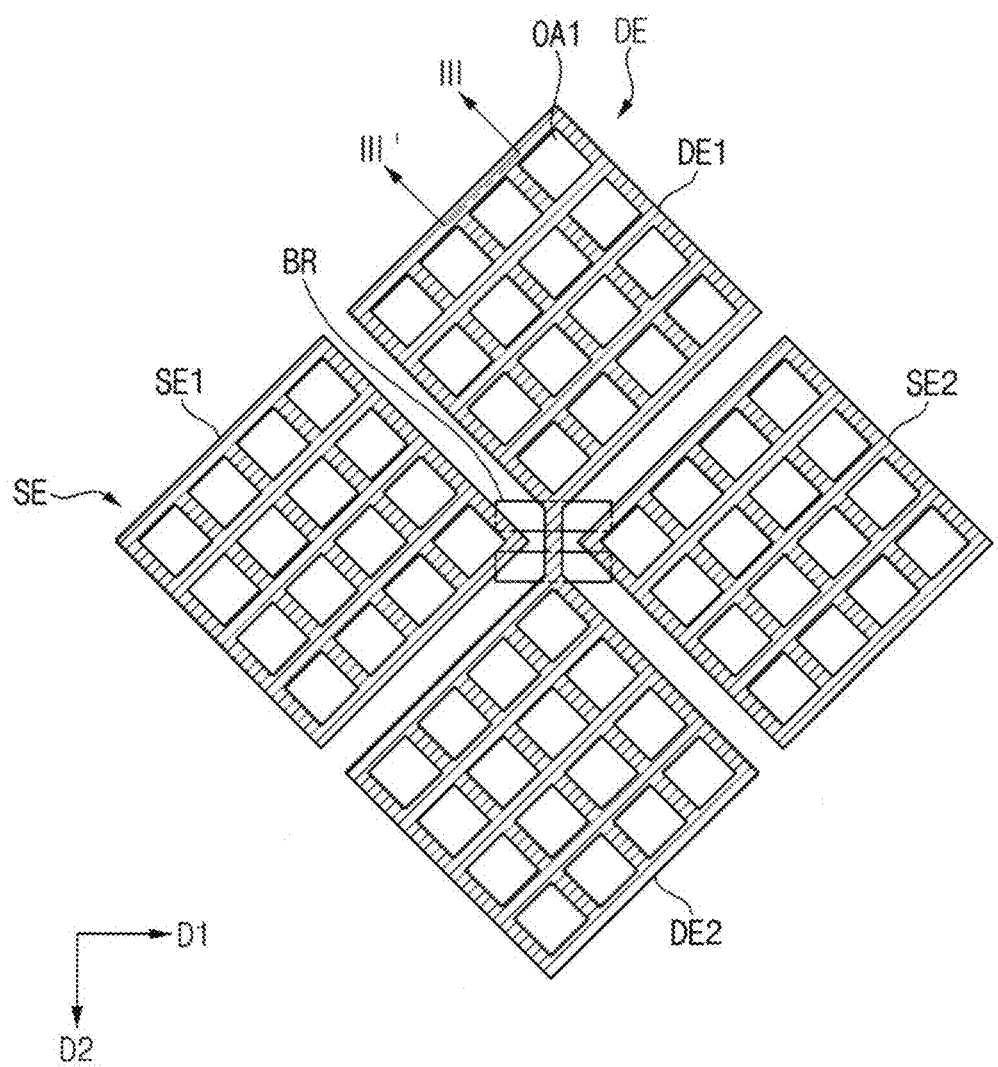
FIG. 10 is an enlarged plan view that illustrates first electrode patterns and second electrode patterns of a touch sensor unit of a display device according to an alternative embodiment of the invention.
Figure 11:
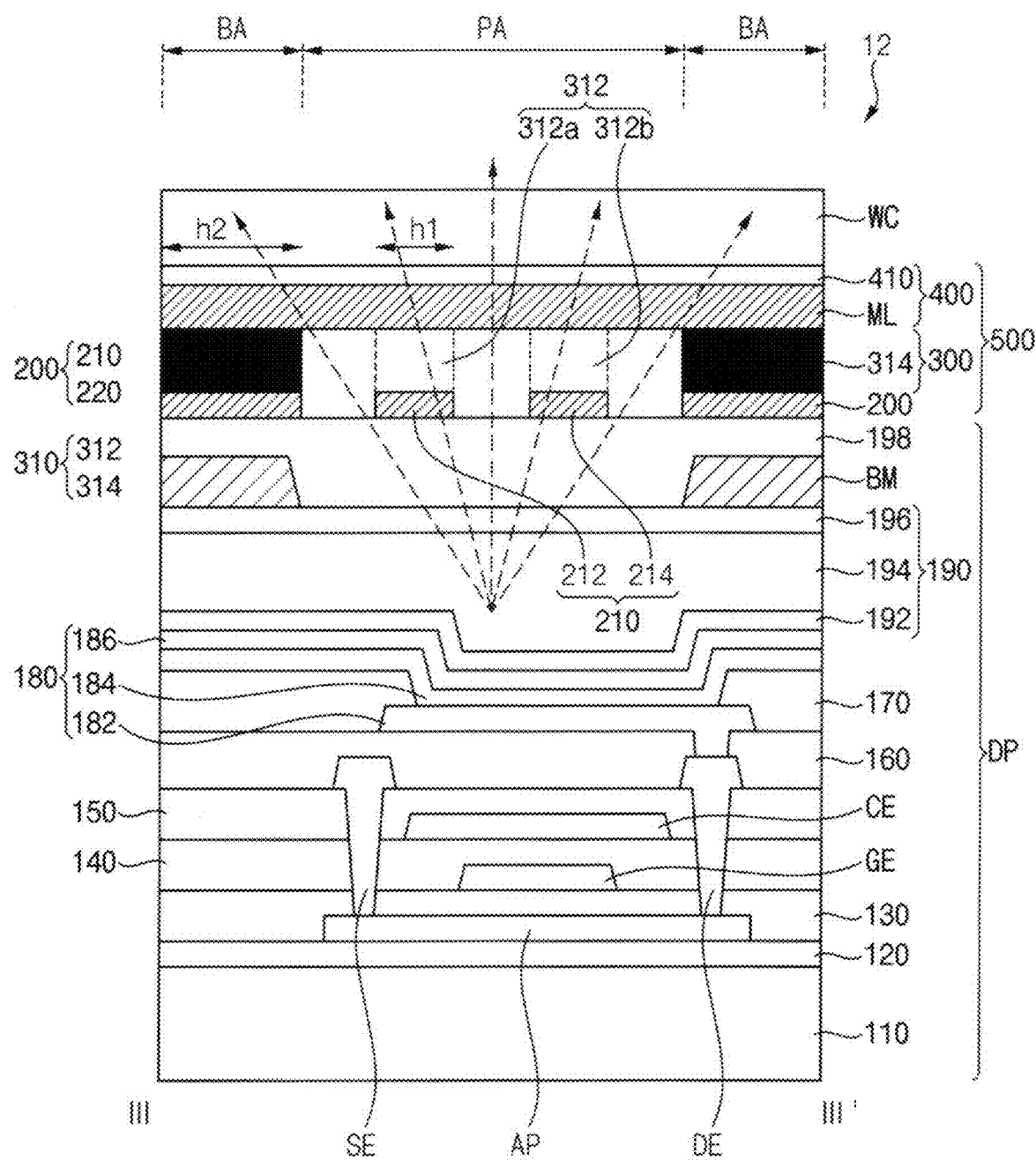
FIGS. 11 and 12 are cross-sectional views taken along line III-III' of FIG. 10.
Figure 12:
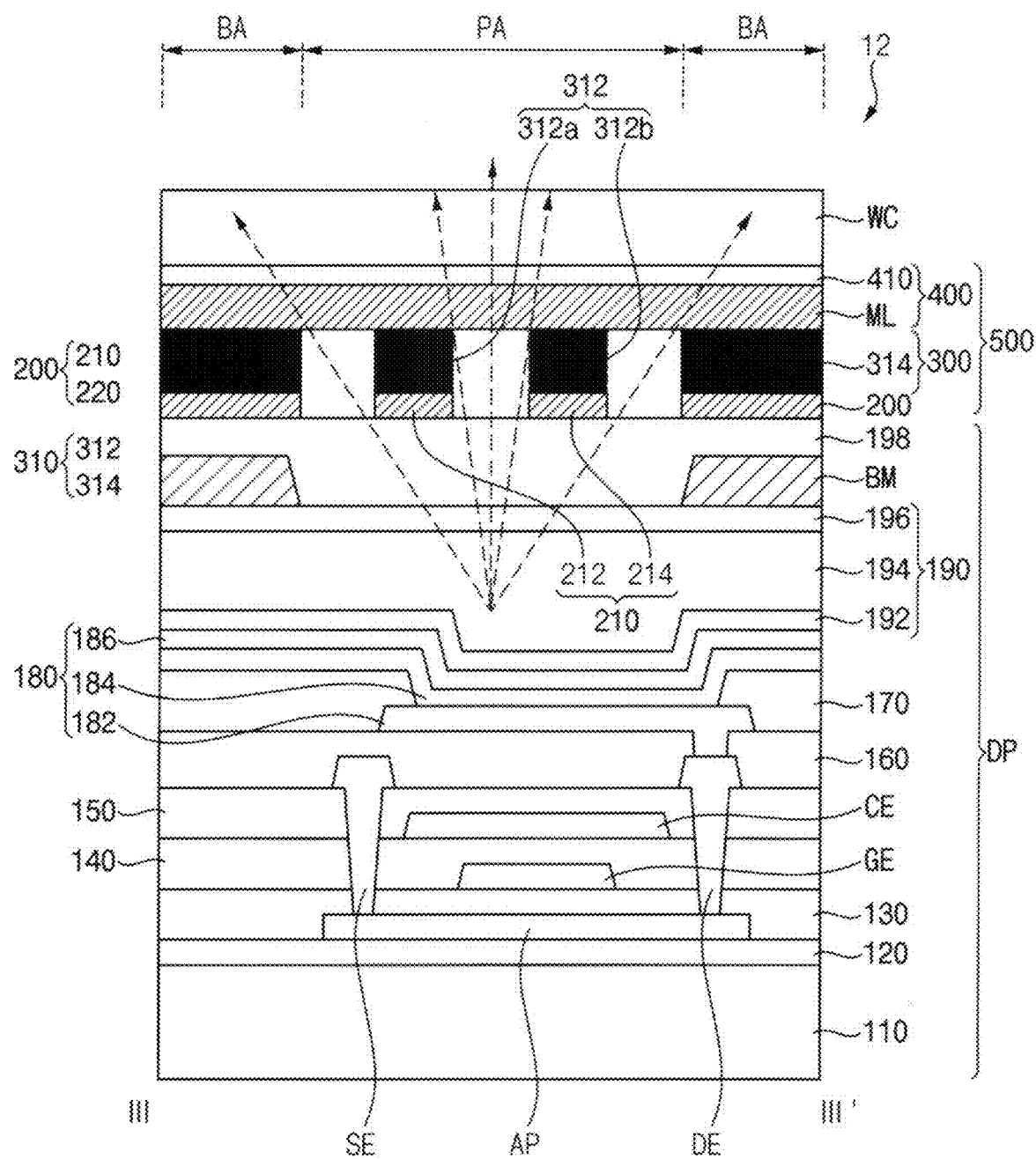

FIG. 10 is an enlarged plan view that illustrates first electrode patterns and second electrode patterns of a touch sensor unit of a display device according to an alternative embodiment of the invention. FIGS. 11 and 12 are cross-sectional views taken along line III-III' of FIG. 10. Particularly, FIGS. 10 to 12 may illustrate an operation method of the display device 12. FIG. 11 may illustrate a case in which the display device 12 is in a first narrow viewing angle mode. FIG. 12 may illustrate a case in which the display device 12 is in a second narrow viewing angle mode.

For convenience of description, any repetitive detailed description of the same or like elements of the display device 12 shown in FIGS. 10 to 12 as those of the display device 10 or 11 described above with reference to FIGS. 1 to 9 will be omitted or simplified.

Referring to FIGS. 10 to 12, in an embodiment, the electrochromic device 500 may include an upper electrode layer 400, an electrochromic layer 300, and a lower electrode layer 200.

In an embodiment, the upper electrode layer 400 may include the touch sensor unit. The upper electrode layer 400 may include a conductive pattern ML that forms a first electrode pattern group (e.g., the first electrode pattern group SEG of FIG. 1) or a second electrode pattern group (e.g., the second electrode pattern group DEG of FIG. 1) of the touch sensor unit. The first electrode pattern group may include first electrode patterns SE that is arranged in the first direction D1. The second electrode pattern group may include second electrode patterns DE that is arranged in the second direction D2.

The lower electrode layer 200 may include a first lower electrode pattern 210 and a second lower electrode pattern 220. The first lower electrode pattern 210 may be disposed in the light emitting area PA of the display device 12. The second lower electrode pattern 220 may be disposed in the light blocking area BA of the display device 12.

In an embodiment, the electrochromic layer 300 may include the electrochromic material only in a portion that overlaps the second lower electrode pattern 220. In an embodiment, the electrochromic layer 300 may include the electrochromic material only in a portion that overlaps the first lower electrode pattern 210. However, the invention is not limited thereto, and alternatively, the electrochromic material may be distributed throughout the entire electrochromic layer 300.

The electrochromic layer 300 may include an electrochromic pattern 310. The electrochromic pattern 310 may be a portion of the electrochromic layer 300 that is discolored in the first and second narrow viewing angle modes to be described later.

The electrochromic pattern 310 may include a first electrochromic pattern 312 that overlaps the light emitting area PA and a second electrochromic pattern 314 that overlaps the light blocking area BA.

The first lower electrode pattern 210 may overlap the first electrochromic pattern 312. The second lower electrode pattern 220 may overlap the second electrochromic pattern 314.

The first electrochromic pattern 312 may include one or more sub-patterns. In one embodiment, for example, the first electrochromic pattern 312 may include a first sub-pattern 312a and a second sub-pattern 312b. In such an embodiment, the first lower electrode pattern 210 may include a first lower sub-pattern 212 and a second lower sub-pattern 214. The first sub-pattern 312a may overlap the first lower sub-pattern 212, and the second sub-pattern 312b may overlap the second lower sub-pattern 214. However, the invention is not limited thereto, and alternatively, the first electrochromic pattern 312 may include three or more sub-patterns.

The electrochromic device 500 of the display device 12 may be converted into a wide viewing angle mode, a first narrow viewing angle mode, and a second narrow viewing angle mode based on an applied voltage. The electrochromic layer 300 may be divided into the wide viewing angle mode and the narrow viewing angle mode based on a voltage difference between the upper electrode layer 400 and the lower electrode layer 200. The narrow viewing angle mode may include the first narrow viewing angle mode and the second narrow viewing angle mode. In one embodiment, for example, the first narrow viewing angle mode may have a relatively wide viewing angle of the display device 12 among the narrow viewing angle modes. The second narrow viewing angle mode may have a relatively narrow viewing angle of the display device 12 among the narrow viewing angle modes. However, embodiments according to the invention are not limited thereto, and the narrow viewing angle mode may include n-th narrow viewing angle modes (n is a natural number).

In the wide viewing angle mode, light generated from the light emitting diode 180 may pass through the electrochromic device 500. In the narrow viewing angle mode, the electrochromic device 500 may absorb a portion of the light generated from the light emitting diode 180. In such an embodiment, in the narrow viewing angle mode, only light that has an angle that is less than a predetermined angle may pass through the electrochromic device 500, and only light that has a predetermined angle or more may be blocked by the electrochromic device 500.

In the wide viewing angle mode, the entire electrochromic layer 300 may not be discolored. That is, the entire electrochromic layer 300 may be in a transparent state. Since the upper electrode layer 400 and the lower electrode layer 200 receive the same voltage, the electrochromic layer 300 may not receive the voltage. Accordingly, the electrochromic layer 300 may maintain a transparent state.

In the first narrow viewing angle mode, only a portion of the electrochromic pattern 310 of the electrochromic layer 300 may be discolored. in an embodiment, in the first narrow viewing angle mode, the first electrochromic pattern 312 may not be discolored, and only the second electrochromic pattern 314 may be discolored. In the second narrow viewing angle mode, the entire electrochromic pattern 310 of the electrochromic layer 300 may be discolored. In such an embodiment, in the second narrow viewing angle mode, not only the second electrochromic pattern 314 but also the first electrochromic pattern 312 may be discolored.

The electrochromic pattern 310 of the electrochromic layer 300 may receive a voltage due to a voltage difference between the upper electrode layer 400 and the lower electrode layer 200. Accordingly, the electrochromic pattern 310 may be discolored by the voltage.

The first lower electrode pattern 210 and the second lower electrode pattern 220 of the lower electrode layer 200 may receive different voltages, respectively. In one embodiment, for example, in the first narrow viewing angle mode, the first lower electrode pattern 210 may receive a same voltage as the voltage that is applied to the upper electrode layer 400. The second lower electrode pattern 220 may receive a voltage that is different from the voltage applied to the upper electrode layer 400. Accordingly, only the second electrochromic pattern 314 that overlaps the second lower electrode pattern 220 may be discolored.

In the second narrow viewing angle mode, both the first lower electrode pattern 210 and the second lower electrode pattern 220 may receive a voltage different from the voltage applied to the upper electrode layer 400. Accordingly, the voltage may be applied to both the first electrochromic pattern 312 that overlaps the first lower electrode pattern 210 and the second electrochromic pattern 314 that overlaps the second lower electrode pattern 220. Accordingly, both the first and second electrochromic patterns 312, 314 may be discolored.

In an alternative embodiment, different voltages may be applied to the first lower sub-pattern 212 and the second lower sub-pattern 214, respectively. Accordingly, the first and second sub-patterns 312a and 312b may be discolored by applying the different voltages to the first lower sub-pattern 212 and the second lower sub-pattern 214, respectively. In such an embodiment, at least one selected from the first and second sub-patterns 312a, 312b may be discolored. In one embodiment, for example, the first sub-pattern 312a and the second sub-pattern 312b may be discolored, simultaneously. In an embodiment, where the first sub-pattern 312a is discolored, the second sub-pattern 312b may not be discolored. In an embodiment, where the second sub-pattern 312b is discolored, the first sub-pattern 312a may not be discolored.

In an embodiment, a width h1 of each of the first and second sub-patterns 312a, 312b may be smaller than a width h2 of the second electrochromic pattern 314. Since the width h1 of each of the first and second sub-patterns 312a, 312b is formed to be small, light emitted from the light emitting diodes 180 of the display device 12 may transmit more than a certain amount even in the narrow viewing angle mode. Accordingly, the resolution of the display device 12 may be secured.

In an embodiment, since the lower electrode layer 200 of the display device 12 includes the first and second lower electrode patterns 212, 214, and the electrochromic layer 300 includes the first and second sub-patterns 312a, 312b, the viewing angle of the display device 12 may be more variously adjusted. Accordingly, the user may adjust the mode of the display device 12 based on a number of viewers. Accordingly, the user may secure the viewing angle desired by the user, and thus the convenience and security of the display device 12 may be improved.

In embodiments, the display devices may be applied to a display device included in a computer, a notebook, a mobile phone, a smartphone, a smart pad, a portable media player ("PMP"), a personal digital assistant ("PDA"), an MP3 player, etc.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display unit including a plurality of light emitting diodes disposed in a light emitting area;
an upper electrode layer disposed on the display unit, wherein the upper electrode layer includes a plurality of first electrode patterns and a plurality of second electrode patterns, the first electrode patterns are arranged in a first direction and electrically connected each other, and the second electrode patterns are arranged in a second direction intersecting the first direction and electrically connected each other;
a lower electrode layer disposed between the upper electrode layer and the display unit; and
an electrochromic layer disposed between the upper electrode layer and the lower electrode layer, wherein the electrochromic layer includes an electrochromic pattern.

2. The display device of claim 1, wherein the first electrode patterns and the second electrode patterns overlap the electrochromic pattern.

3. The display device of claim 1, wherein the lower electrode layer overlaps the display device, entirely.

4. The display device of claim 1, wherein each of the first electrode patterns and the second electrode patterns has a mesh shape.

5. The display device of claim 1, wherein the first electrode patterns and the second electrode patterns collectively define a touch sensor unit.

6. The display device of claim 1, wherein
the electrochromic layer is converted to a wide viewing angle mode and a narrow viewing angle mode based on a voltage applied thereto,
the electrochromic pattern is not discolored in the wide viewing angle mode, and is discolored in the narrow viewing angle mode.

7. The display device of claim 6, wherein
the lower electrode layer receives a same voltage as a voltage applied to the first electrode patterns in the wide viewing angle mode, and
the lower electrode layer receives a different voltage from a voltage applied to the first electrode patterns in the narrow viewing angle mode.

8. The display device of claim 1, wherein the electrochromic pattern is discolored when a voltage difference between the upper electrode layer and the lower electrode layer exists.

9. The display device of claim 1, wherein
the first electrode patterns receive a first voltage, and
the second electrode patterns periodically receive a second voltage different from the first voltage.

10. The display device of claim 9, wherein the electrochromic pattern overlaps the first electrode patterns and does not overlap the second electrode patterns.

11. The display device of claim 1, further comprising:
a black matrix disposed in a light shielding area which surrounds the light emitting area,
wherein the electrochromic pattern overlaps the black matrix.

12. The display device of claim 11, wherein
the electrochromic layer includes a first area which overlaps the light emitting area and a second area which overlaps the light shielding area, and
the electrochromic pattern is disposed in the second area.

13. The display device of claim 12, wherein
the second area includes an electrochromic material, and
the first area includes a material which is not discolored when a voltage is applied thereto.

14. The display device of claim 12, wherein the first area and the second area include an electrochromic material.

15. The display device of claim 11, wherein the electrochromic pattern includes a first electrochromic pattern which overlaps the light emitting area and a second electrochromic pattern which overlaps the black matrix.

16. The display device of claim 15, wherein the lower electrode layer includes a first lower electrode pattern which overlaps the first electrochromic pattern and a second lower electrode pattern which overlaps the second electrochromic pattern.

17. The display device of claim 16, wherein the electrochromic layer includes an electrochromic material in a portion which overlaps the first lower electrode pattern.

18. The display device of claim 16, wherein
the first electrochromic pattern includes one or more sub-patterns, and
at least one sub-pattern of the sub-patterns is discolored.

19. The display device of claim 18, wherein a width of each of the sub-patterns is less than a width of the second electrochromic pattern.

20. The display device of claim 16, wherein
the electrochromic layer is converted to a wide viewing angle mode, a first narrow viewing angle mode, and a second narrow viewing angle mode based on a voltage applied thereto,
wherein the first electrochromic pattern is not discolored and the second electrochromic pattern is discolored in the first narrow viewing angle mode; and
the first electrochromic pattern and the second electrochromic pattern are discolored in the second narrow viewing angle mode.

* * * * *